(12) United States Patent
Kume et al.

(10) Patent No.: US 10,845,589 B2
(45) Date of Patent: Nov. 24, 2020

(54) OPTICAL APPARATUS, MACHINING APPARATUS, AND ARTICLE MANUFACTURING METHOD

(71) Applicant: CANON KABUSHIKI KAISHA, Tokyo (JP)

(72) Inventors: Masaharu Kume, Utsunomiya (JP); Yukihiro Inoue, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 340 days.

(21) Appl. No.: 15/688,495

(22) Filed: Aug. 28, 2017

(65) Prior Publication Data

US 2018/0059407 A1    Mar. 1, 2018

(30) Foreign Application Priority Data

Aug. 30, 2016    (JP) .................. 2016-168612

(51) Int. Cl.
*G02B 26/10*    (2006.01)
*B23K 26/064*    (2014.01)
(Continued)

(52) U.S. Cl.
CPC .......... *G02B 26/105* (2013.01); *B23K 26/043* (2013.01); *B23K 26/0643* (2013.01); *B23K 26/082* (2015.10); *B23K 26/38* (2013.01); *B23K 26/382* (2015.10); *G02B 7/1821* (2013.01); *G02B 19/0019* (2013.01); *G02B 19/0028* (2013.01); *G02B 26/0816* (2013.01);
(Continued)

(58) Field of Classification Search
CPC ............ G02B 19/0019; G02B 7/1821; G02B 26/0816; G02B 26/105; G02B 19/0028; B23K 26/043; B23K 26/082; B23K 26/0643; B23K 26/0642; B23K 26/402
See application file for complete search history.

(56) References Cited

U.S. PATENT DOCUMENTS 4,215,912 A    8/1980 Minoura
4,707,596 A *  11/1987 Hohberg ............. B23K 26/043
                                              219/121.78
(Continued)

FOREIGN PATENT DOCUMENTS

CN    105607248 A    5/2016
CN    105892231 A    8/2016
(Continued)

*Primary Examiner* — Geoffrey S Evans
(74) *Attorney, Agent, or Firm* — Canon U.S.A., Inc. IP Division (57) ABSTRACT

An optical apparatus includes a rotatable reflecting member including a first reflecting surface and a second reflecting surface, an optical system including a plurality of reflecting surfaces and configured to sequentially reflect light having been reflected at the first reflecting surface at the plurality of reflecting surfaces to make the light incident on the second reflecting surface, a driving part configured to change an angle of the reflecting member, a control unit configured to control the driving part to change a path of light emitted from the reflecting member after being reflected at the second reflecting surface, and a light incident portion configured to recognize a position of the light having been reflected at the first reflecting surface.

18 Claims, 11 Drawing Sheets

(51) Int. Cl.
*G02B 19/00* (2006.01)
*G02B 26/08* (2006.01)
*B23K 26/04* (2014.01)
*G02B 7/182* (2006.01)
*B23K 26/38* (2014.01)
*B23K 26/382* (2014.01)
*B23K 26/082* (2014.01)
*B23K 26/06* (2014.01)
*G02B 27/18* (2006.01)
*G02B 27/30* (2006.01)
*G03F 7/20* (2006.01)

(52) U.S. Cl.
CPC ............ *G02B 26/101* (2013.01); *G02B 27/18* (2013.01); *G02B 27/30* (2013.01); *G03F 7/70108* (2013.01)

(56) References Cited

U.S. PATENT DOCUMENTS

| | | | | |
|---|---|---|---|---|
| 4,840,483 A | * | 6/1989 | Haffner | B23K 26/043 356/153 |
| 5,923,418 A | * | 7/1999 | Clark | G01S 17/66 356/153 |
| 6,067,127 A | * | 5/2000 | Bardmesser | G02B 26/129 348/750 |
| 10,663,716 B2 | * | 5/2020 | Kume | G02B 17/023 |
| 2007/0145025 A1 | * | 6/2007 | Yamazaki | B23K 26/043 219/121.74 |
| 2016/0139403 A1 | * | 5/2016 | Kume | G02B 26/0816 219/121.85 |

FOREIGN PATENT DOCUMENTS

| | | |
|---|---|---|
| EP | 3021153 A1 | 5/2016 |
| GB | 2316253 A | 2/1998 |
| JP | H08-236847 A | 9/1996 |
| JP | H10-318718 A | 12/1998 |
| JP | 2016-103007 A | 6/2016 |
| TW | 200633807 A | 10/2006 |
| TW | 200711773 A | 4/2007 |
| TW | 201206603 A | 2/2012 |
| TW | 1420146 B | 12/2013 |
| TW | 201617684 A | 5/2016 |

* cited by examiner

OPTICAL APPARATUS, MACHINING APPARATUS, AND ARTICLE MANUFACTURING METHOD

BACKGROUND OF THE INVENTION

Field of the Invention

The present invention relates to an optical apparatus, a machining apparatus, and an article manufacturing method.

Description of the Related Art

An optical scanning apparatus in a laser machining apparatus and the like may include a translational optical system, a condensing optical system, and a deflection optical system to condense light from azimuth (θx, θy) and irradiate a position (x, y, z) on an object with the condensed light. The translational optical system is an optical system that translates (parallel shift) light incident on a condensing optical system described below to change the azimuth (see Japanese Patent Application Laid-Open No 2016-103007). The condensing optical system is an optical system that changes a focus position (z) of light to condense the light on an object. The deflection optical system (also referred to as a scanning optical system) includes a deflecting optical element such as a mirror to change a light irradiation position (x, y). Of these optical systems, a translational optical system discussed in Japanese Patent Application Laid-Open No 2016-103007 includes a rotatable reflecting member having a first reflecting surface and a second reflecting surface. The translational optical system also includes an optical system that sequentially reflects light, that has been reflected by the first reflecting surface, at a plurality of reflecting surfaces to make the light incident on the second reflecting surface. The translational optical system further includes an adjusting unit that adjusts a path of light that has been reflected by the second reflecting surface and emitted from the reflecting member by changing the rotational angle of the reflecting member. Such a configuration realizes translation (parallel shift) of light that is finally emitted from the reflecting member. Further, by disposing two sets of the translational optical systems, the light can be translated in two axial directions. When light having been emitted from the reflecting member is eccentrically shifted and incident on a condensing optical system (condenser lens), the condensed light inclined at an inclination angle determined from the eccentric amount and a focal length of the condensing optical system is emitted from the condensing optical system. The condensed light may be used to machine an object in a light machining apparatus and the like. In the light machining apparatus, an object is irradiated with the condensed light, for example to drill a hole in the object by thermal effect or wave effect.

To use such a configuration, a position and an angle of (laser) light incident on a light inlet of an optical scanning apparatus have to be controlled, and if necessary adjusted, accurately. In order to accurately adjust the angle, in addition to the alignment at the light inlet, alignment of the light by observing (monitoring) or measuring the light at a position where the light has a comparatively small diameter on the light path inside the optical scanning apparatus is needed. For the observation or measurement, a protective cover of the optical scanning apparatus is removed, a target plate (fluorescent plate or the like) is inserted into the light path, and a position of the bright spot on the plate is visually observed or an image thereof is picked up, which can be troublesome. The path of the incident light may be adjusted (e.g., an installation state such as a position or an orientation of a light source may be adjusted) depending on the result of the visual inspection (observation) or the picking up of an image indicating the path of the incident light. It is not preferable to require such a time-consuming adjustment so frequently.

In addition, the removal of the protective cover increases the risk of damaging the optical element with dust adhering thereon encouraged by a high energy light (e.g., laser light). For this reason, it may be necessary to maintain a clean environment whenever such an optical scanning apparatus is used. In addition, such an optical scanning apparatus may have to be equipped with a special protective tool to protect the users (workers), which can be difficult to remove. Due to these aforementioned points and other practical issues, the adjustment as described above can be troublesome.

SUMMARY OF THE INVENTION

According to an embodiment, the present invention is directed to an optical apparatus advantageously achieves an adjustment of a path of an incident light.

According to an aspect of the present invention, an optical apparatus includes a reflecting member including a first reflecting surface and a second reflecting surface, an optical system including a plurality of reflecting surfaces and configured to sequentially reflect light, which has been reflected by the first reflecting surface, on the plurality of reflecting surfaces to guide the light to the second reflecting surface, a driving part configured to change an angle of incidence of the light on the first reflecting surface of the reflecting member, a control unit configured to control the driving part so that a path of the light output from the reflecting member after the light has been reflected on the second reflecting surface can be controlled, and a light incident portion configured to indicate a position of the incident light after the light has been reflected by the first reflecting surface.

Further features of the present invention will become apparent from the following description of exemplary embodiments with reference to the attached drawings. Each of the embodiments of the present invention described below can be implemented solely or as a combination of a plurality of the embodiments or features thereof where necessary or where the combination of elements or features from individual embodiments in a single embodiment is beneficial.

DESCRIPTION OF THE EMBODIMENTS

Hereinafter, exemplary embodiments of the present invention will be described with reference to the accompanying drawings. Throughout the drawings for describing the exemplary embodiments, the same members and the like are denoted by the same signs in principle (unless otherwise noted), and repeated description thereof is not provided.

Figure 2:
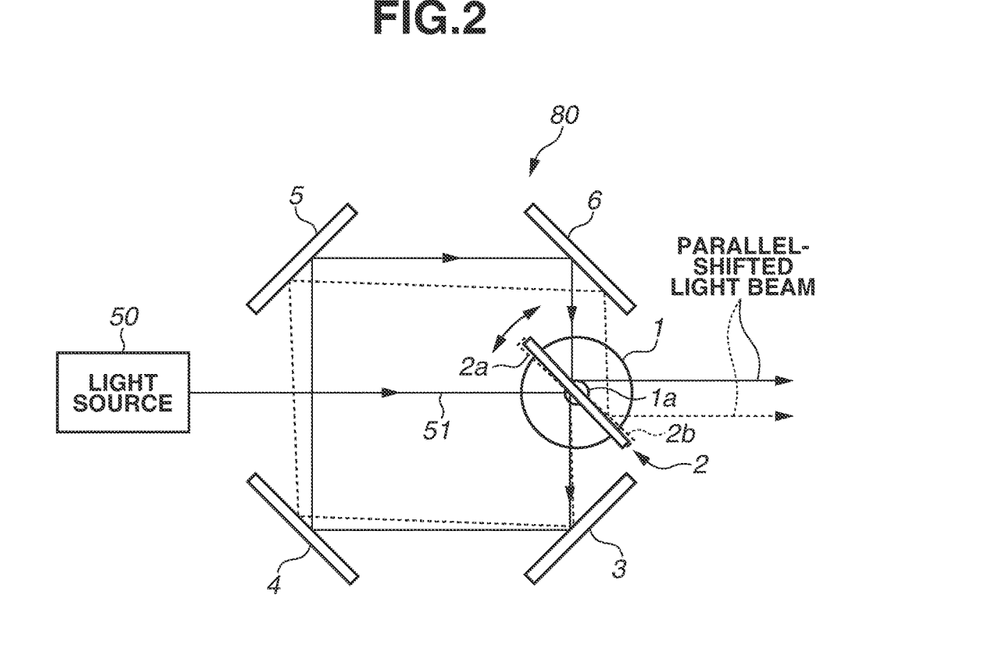
FIG. 2 illustrates a configuration example of a part of the optical apparatus.

FIG. 2 illustrates a configuration example of a part of an optical apparatus according to a first exemplary embodiment. The optical apparatus according to the present exemplary embodiment can control a path of emitted light (a light path). For example, the optical apparatus can translate a light beam parallel shift mechanism (a translational optical system) according to the present exemplary embodiment includes a mirror member 2 (also referred to as a reflecting member) that reflects a light beam 51 from a light source 50. In the following description, it is assumed that each reflecting surface can be regarded as a flat surface and a light path is translated. The mirror member 2 is made of, for example, glass, and has a first reflecting surface 2a that receives the light beam 51 from the light source 50 and a second reflecting surface 2b on the opposite side. The first reflecting surface 2a and the second reflecting surface 2b each has a coating with a high reflectivity. The mirror member 2 may be formed in a prism shape, and the first reflecting surface 2a and the second reflecting surface 2b may be independent from each other. For example, they may not be on opposite sides. However, the relative positional relationship between the first reflecting surface 2a and the second reflecting surface 2b may desirably be fixed.

Figure 5:
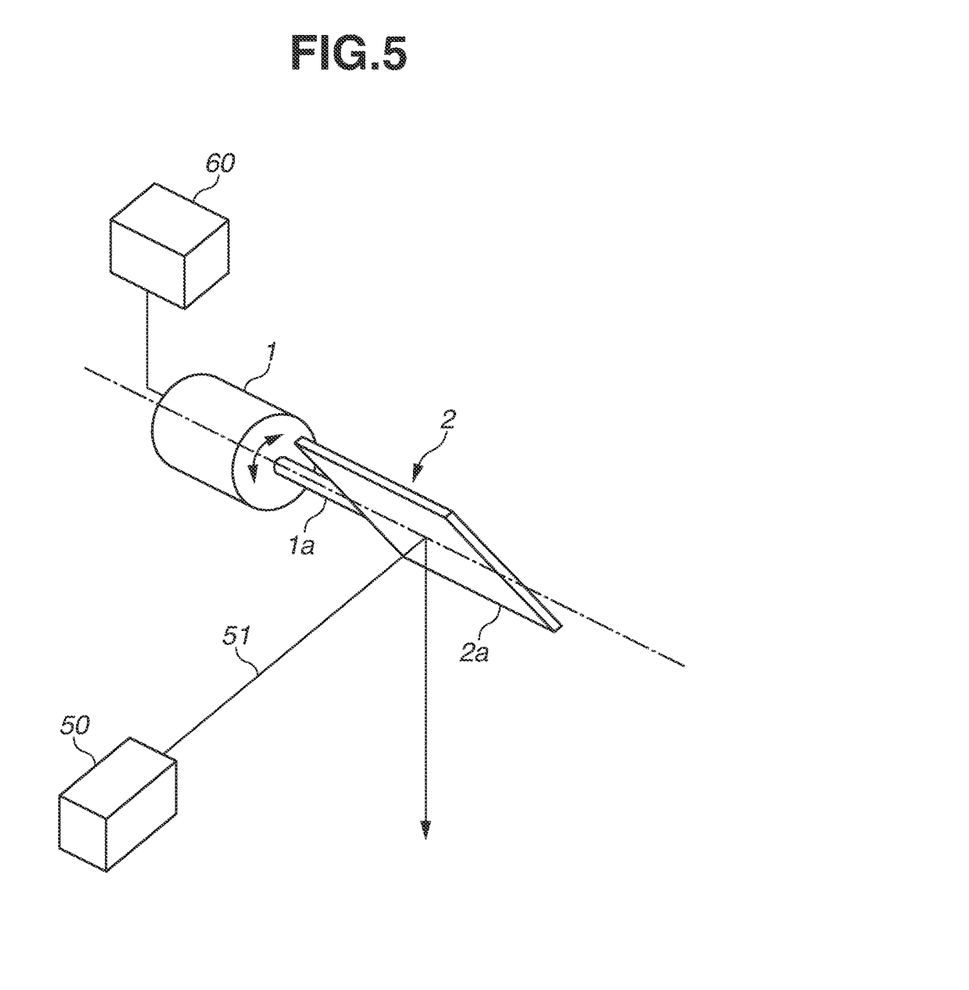
FIG. 5 illustrates a configuration example of a driving part that changes an angle of a reflecting member.

The mirror member 2 is configured to be variable in its angle (a variable angular position or orientation in relation to incident light) to enable a control (change) of a path of the light that has been emitted (output) from the optical apparatus. FIG. 5 illustrates a configuration example of a driving part (1) that changes an angle of the reflecting member (2). As illustrated in FIG. 5, according to the present configuration example the mirror member 2 is pivotally supported by an output shaft 1a of a (galvanometer) motor 1 (i.e., a driving part). A control unit 60 outputs a driving signal to the motor 1, and the motor 1 rotates the mirror member 2 via the output shaft 1a by a driving amount (i.e. an angular position or orientation change amount) corresponding to the driving signal. In this way, the mirror member 2 is configured to be rotatable (i.e. variable in its angle of incidence with the incident light beam). In FIG. 5, the mirror member 2 is inclined at about 45 degrees with respect to the light beam 51 emitted from the light source 50.

This translational optical system according to the first exemplary embodiment has an optical system 80 that sequentially reflects light, the light having been reflected by the mirror member 2, at a plurality of reflecting surfaces to make the light incident on the mirror member 2 again by guiding the light back to the mirror member 2. The optical system 80 includes, for example, four mirrors 3, 4, 5 and 6 (reflecting surfaces) fixedly arranged to be axisymmetric with respect to the light beam 51. The light, having been reflected by the first reflecting surface 2a of the mirror member 2, is sequentially reflected on these mirrors 3, 4, 5, and 6 and guided to the second reflecting surface 2b of the mirror member 2. The optical system 80 is arranged so that the light that has been reflected on the second reflecting surface 2b and finally emitted (output) from the mirror member 2 has a travel direction that is substantially identical (or substantially parallel) to the travel direction of the light beam 51 just before it was incident on the first reflecting surface 2a. It is understood that according to an embodiment, any optical system comprising at least one reflecting surface (mirror), or a plurality of reflecting surfaces (mirrors), may be used as long as the optical system is capable of guiding the light so that it is reflected on both the first and second reflecting surfaces 2a, 2b of the reflecting (mirror) member 2 whilst maintaining the substantially identical (or substantially parallel) travel direction between before and after the light engages the reflecting (mirror) member 2. For example, with respect to the path of the light beam 51, the reflecting surfaces of the four mirrors 3, 4, 5, and 6 in FIG. 2 may be arranged to be at 45 degrees.

The angle (and hence the traveling direction) of the emitted (output) light does not change even if the rotation angle (angular position or orientation) of the mirror member 2 is changed. Therefore, by using the control unit 60 to control the rotation angle (angular position or orientation) of the mirror member 2, a path of the light that has been reflected on the second reflecting surface 2b and is emitted from the mirror member 2 can be adjusted, i.e. translated or in its parallel shift adjusted.

Figure 3:
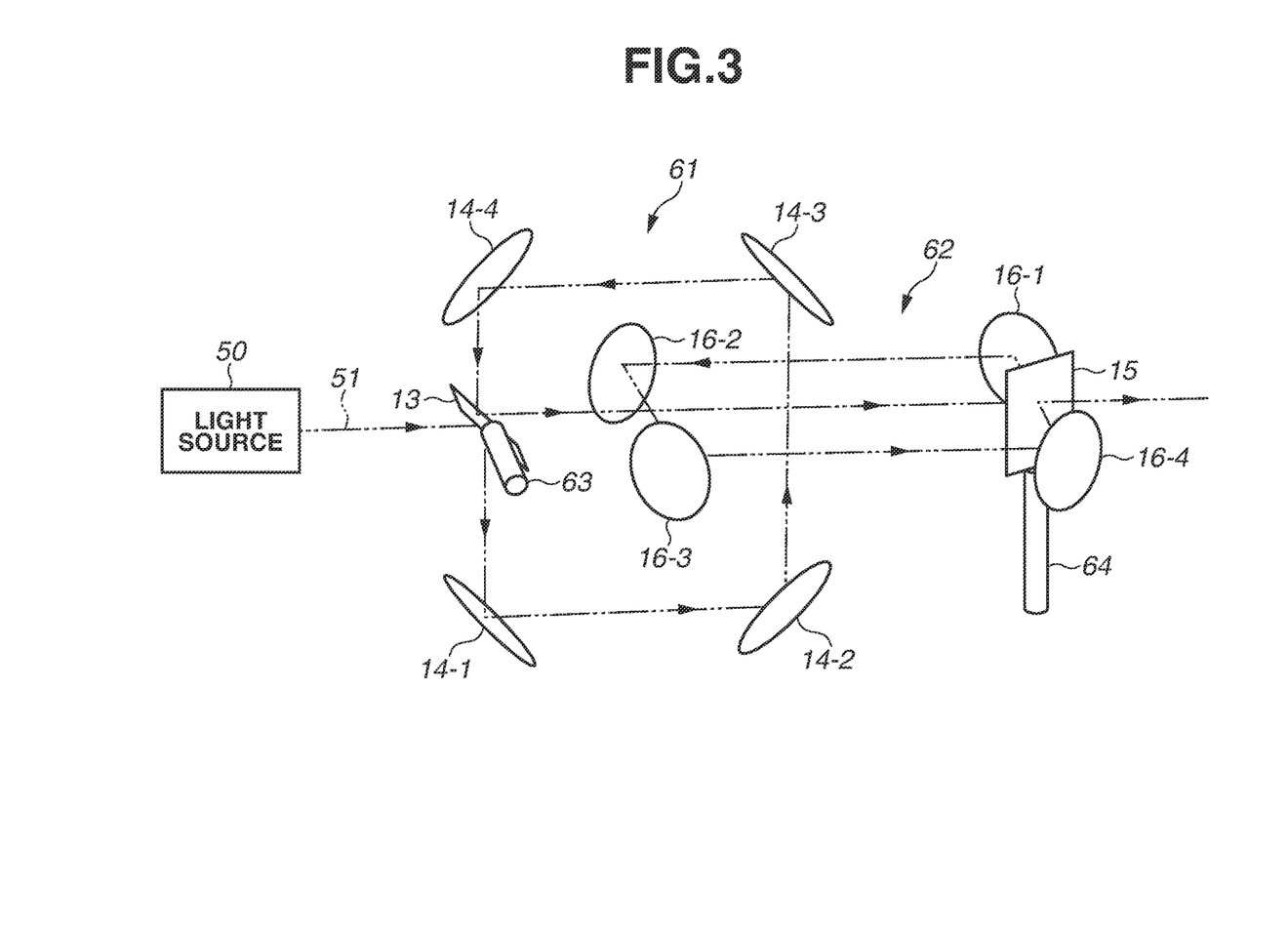
FIG. 3 illustrates another configuration example of a part of the optical apparatus.

FIG. 3 illustrates another configuration example of a part of the optical apparatus. This configuration is a combination of the components illustrated in FIG. 2 and includes a first translational optical system 61 that receives the light beam 51 from the light source 50 and a second translational optical system 62 that receives the light emitted (output) from the first translational optical system 61. The first translational optical system 61 has an angle-variable mirror member 13 that reflects the light beam 51 emitted from the light source 50. The angle-variable mirror member 13 corresponds to the mirror member 2 in FIG. 1. The first translational optical system 61 includes mirrors 14-1, 14-2, 14-3, and 14-4 corresponding to the mirrors 3, 4, 5 and 6 in FIG. 1. The second translational optical system 62 includes an angle-variable mirror member 15 that reflects a light beam emitted from the first translational optical system. The angle-variable mirror member 15 corresponds to the mirror member 2 in FIG. 1. The second translational optical system 62 also includes mirrors 16-1, 16-2, 16-3, and 16-4 corresponding to the mirrors 3, 4, 5 and 6 in FIG. 1. A rotatable shaft of the mirror member 13 of the first translational optical system 61 and a rotatable shaft 64 of the mirror member 15 of the second translational optical system 62 are positioned to be nonparallel, for example orthogonal to each other.

In the first translational optical system 61, incident light, having been reflected by a first reflecting surface of the mirror member 13, is sequentially reflected on the mirrors 14-1, 14-2, 14-3, and 14-4, and is guided to a second reflecting surface on the side of the mirror member 13 opposite to the first reflecting surface. The light, having been reflected by the second reflecting surface and emitted from the mirror member 13, is incident on the mirror member 15 of the second translational optical system 62. In the second translational optical system 62, the incident light, having been reflected by a first reflecting surface of the mirror member 15, is sequentially reflected on the mirrors 16-1, 16-2, 16-3, and 16-4, and guided to a second reflecting surface on the side of the mirror member 15 opposite to the first reflecting surface of the mirror member 15. The light that has been reflected at the second reflecting surface of the mirror member 15 and finally (eventually) emitted (output) from the mirror member 15 has a travel direction that is substantially identical (substantially parallel) to the travel direction of the light beam 51 when it engaged the first reflecting surface of the mirror member 13 of the first translational optical system 61. As illustrated in FIG. 3, an arrangement in which a first plane comprising the light paths from the reflection by the respective mirrors of the first translational optical system 61 and a second plane comprising the light paths from the reflection by respective mirrors of the second translational optical system 62 intersect each other may be employed. By arranging the two translational optical systems so that the first and second planes intersect with each other as described above, it is possible to reduce the size of the optical apparatus.

Figure 4:
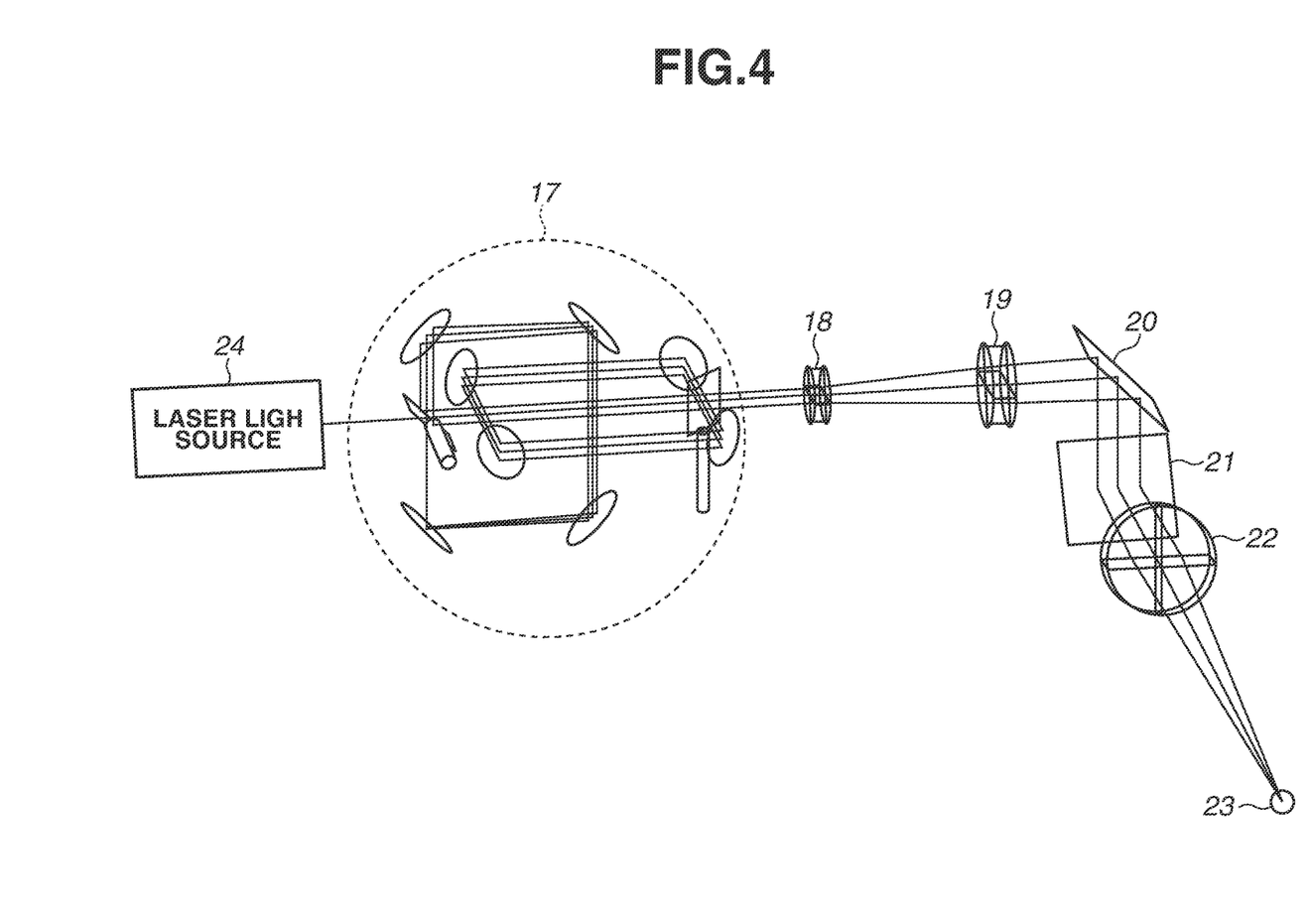
FIG. 4 illustrates a configuration example of a machining apparatus including the optical apparatus shown in any one of FIGS. 1 to 3.

Here, a machining apparatus including the above-described optical apparatus (the translational optical system) and an optical system that guides (irradiates) the light, having been emitted from the optical apparatus, to an object will be described. FIG. 4 illustrates a configuration example of the machining apparatus including the optical apparatus. The machining apparatus according to the present exemplary embodiment includes the optical apparatus (translational optical system) 17 described with reference to FIG. 3 at the rear side (rear stage) of a laser light source 24. On the rear side thereof, the machining apparatus includes a light beam expanding optical systems 18 and 19, thereby expanding the light beam so that it has the necessary translation amount and diameter. In addition, on the rear side of the light beam expanding optical systems, the machining apparatus includes a condensing optical system (condenser lens) 22, thereby condensing the laser light to irradiate an object 23 positioned on the focal plane with the condensed laser light. In addition, the machining apparatus includes (galvanometer) mirrors 20 and 21 (a deflection optical system) between the light beam expanding optical system 19 and the condensing optical system 22, and irradiates a target position (x, y) on the object 23 with the condensed light by adjusting the rotation angle (angular position or orientation) of the mirrors 20 and 21. The above configuration allows a parallel eccentric shift of the light beam incident on the condensing optical system by the translational optical system 17, and thus allows a change (adjustment) of an angle of the laser beam that is emitted from the condensing optical system and incident on the object 23 (an incident angle). As a result, it is possible to form a tapered hole on the object or the object can be cut to have an oblique cross section.

Figure 1:
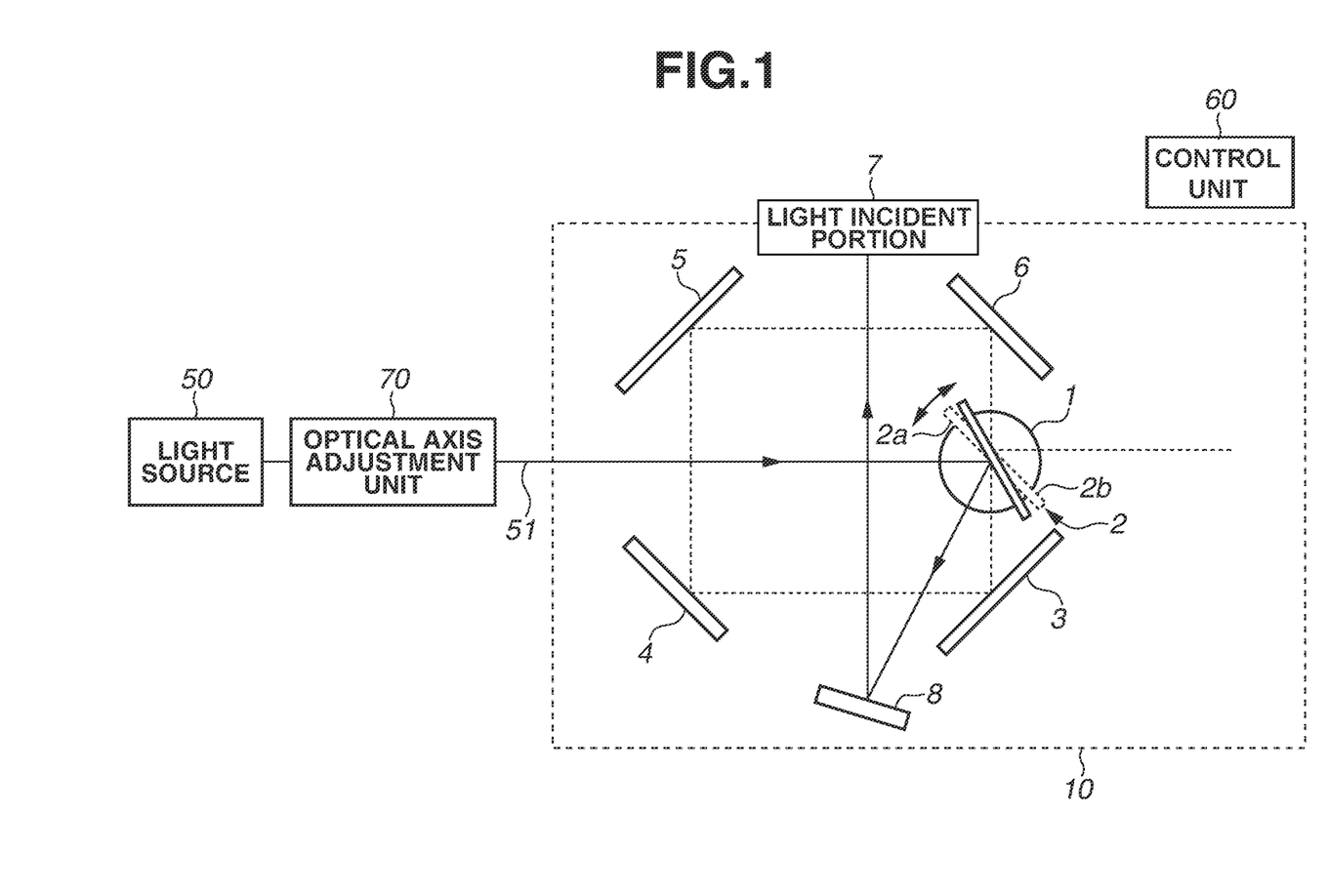
FIG. 1 illustrates a configuration example of an optical apparatus according to a first exemplary embodiment.
Figure 6:
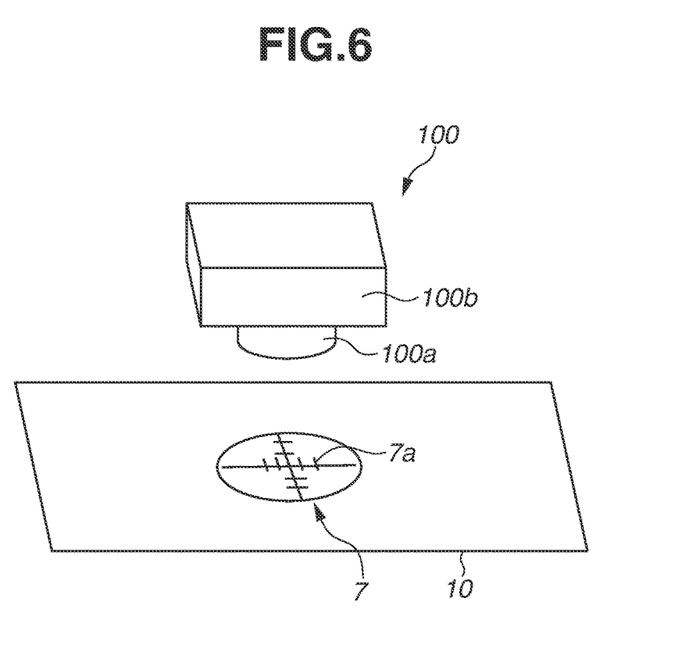
FIG. 6 illustrates a configuration example of a light incident portion.

FIG. 1 illustrates a configuration example of the optical apparatus according to the first exemplary embodiment. The optical apparatus includes the translational optical system described with reference to FIG. 2. FIG. 1 illustrates a state (shown in solid line) where the mirror member 2 is set at an angle for an optical axis adjustment (an angle obtained by rotating the mirror member 2 by a relatively large angle from an angle tilted by approximately 45 degrees with respect to the light beam 51 output from the optical axis adjustment unit 70). In this optical axis adjustment state, the light beam reflected by the mirror member 2 does not reach the fixed mirror 3, 4, 5, or 6, but is guided to a light incident portion 7 via another fixed mirror 8 (a reflective optical element). FIG. 6 illustrates a configuration example of the light incident portion. According to an exemplary embodiment, the light incident portion 7 is provided on a cover (casing or housing) 10 of the optical apparatus and may comprise, for example, a screen (e.g., a frosted glass plate) for observing the light, the screen including an index (line 7a) used to recognize (indicate) a position of the incident light. In addition thereto, an image pickup unit 100 (including, for example, a lens 100a and a television (TV) camera 100b) for picking up an image of the incident light on the screen may be provided. Instead of the screen, a detecting element for detecting the position of the incident light (a light position detecting element such as a photodiode array, or a multi-divided photodiode) or a light transmission window that transmits the light to the outside of the cover (i.e. to the outside of the optical apparatus) 10 may be provided. When a light transmission window is provided, at least one of a screen, a light position detecting element, and an image pickup unit for recognizing (indicating) a position of an incident light transmitted through the window is preferably provided outside the cover 10 (the optical apparatus).

The position (deviation) of a light beam can be recognized (determined) by reading the position of the bright spot on the screen with the index (line 7a). The optical axis adjustment (the adjustment of the light path of the light incident on the optical apparatus) can be achieved by, for example, adjusting so that the light is incident on a predetermined position (e.g., center) in a light inlet portion of the optical apparatus, and the light is incident on a predetermined position (e.g., center) on the light incident portion 7. The optical axis adjustment can be performed by at least one of an adjustment of an arrangement state of the light source 50 and adjustment of a path of the light that has been emitted (output) from the light source 50 (the light path). The adjustment of the light path can be performed, for example, by adjusting the two angle-variable mirrors provided between the light source 50 and the light inlet portion of the optical apparatus. More specifically, first, an angle of the angle-variable mirror closer to the light source 50 is adjusted so that the light is incident on a predetermined position in the light inlet portion. Next, an angle of an angle-variable mirror farther from the light source 50 is adjusted so that the light is incident on a predetermined position on the light incident portion 7. An incident position of the light then slightly deviates from the predetermined position in the light inlet portion. Thus, the angle of the angle-variable mirror closer to the light source 50 is adjusted again so that light is incident on the predetermined position in the light inlet portion. An incident position of the light then slightly deviates from the predetermined position on the light incident portion 7. Thus, the angle of the angle-variable mirror farther from the light source 50 is adjusted again so that light is incident on the predetermined position on the light incident portion 7. By repeating a series of adjustment operations a plurality of times, it is possible to make the light incident on the predetermined position of the light introducing (inlet) portion and to make the light incident on the predetermined position of the light incident portion 7.

Although the optical axis adjustment unit 70 is exemplified to have two angle-variable mirrors, the optical axis adjustment unit 70 is not limited thereto. The optical axis adjustment unit 70 may comprise any arrangement as long as it can change an incident position and an incident angle of light falling on the mirror member 2. For example, the optical axis adjustment unit 70 can be realized by a combination of a mirror capable of changing both the incident position and the incident angle, and a fixed mirror. Further, in the case where light is emitted (output) from the optical apparatus at a target incident position and a target incident angle, the light is made incident on the light incident portion 7, and the incident position of the light on the light incident portion 7 is recognized (determined), whereby the optical axis can be adjusted with a target incident position on the light incident portion 7 in mind.

According to the present exemplary embodiment, for example, it is possible to provide an optical apparatus that is advantageous in adjusting a path of the incident light, as discussed in the above description.

Figure 7:
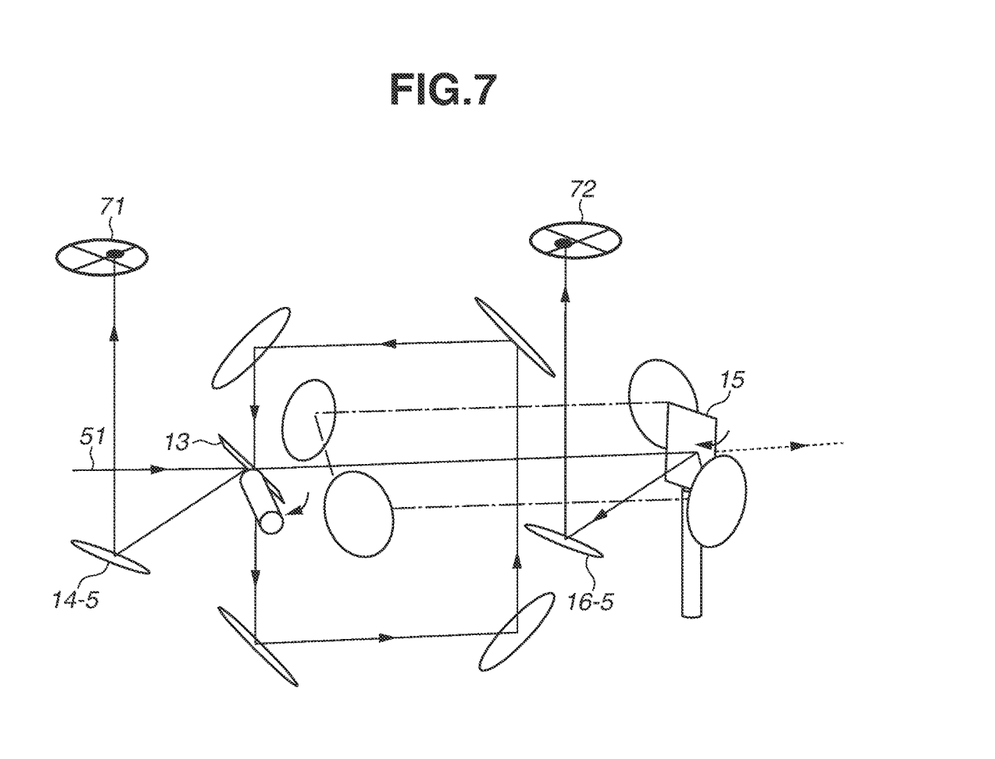
FIG. 7 illustrates a configuration example of an optical apparatus according to a second exemplary embodiment.

FIG. 7 illustrates a configuration example of an optical apparatus according to a second exemplary embodiment. This configuration includes the first translational optical system 61 described with reference to FIG. 3, that is, the first translational optical system 61, on which the light beam 51 emitted from the light source 50 (or the optical axis adjustment unit 70) is incident, and the second translational optical system 62 on which the light having been emitted from the first translational optical system 61 is incident.

In FIG. 7, first, the mirror member 13 is set at an angle for an optical axis adjustment (i.e., an angle that is different from a predetermined angle obtained by inclining the mirror member 13 by approximately 45 degrees with respect to the light beam 51 from the light source 50). With this setting, the light having been reflected by the mirror member 13 does not reach the mirrors 14-1, 14-2, 14-3, or 14-4, and is incident on the first light incident portion 71 via another mirror 14-5 (a reflective optical element). The position (deviation) of the light (beam) can be recognized (determined) by reading the position of the light incident on the first light incident portion 71 based on an index (line 7a) provided on the first light incident portion 71.

Next, the mirror member 13 is set at a reference angle (e.g., 45 degrees) with respect to the light beam 51 emitted from the light source 50, and the mirror member 15 is set at an angle for an optical axis adjustment (an angle that is different from a reference angle obtained by inclining the mirror member 15 by approximately 45 degrees with respect to the light beam 51 emitted from the light source 50). When in this setting, the light having been reflected by the mirror member 15 does not reach the mirrors 16-1, 16-2, 16-3, or 16-4, and is incident on a second light incident portion 72 via another mirror 16-5 (another reflective optical element). The position (deviation) of the light (beam) can be recognized (determined) by reading the position of the light incident on the second light incident portion 72 based on an index (line) provided thereon. Since a distance (a second light path length) from the light source 50 to the second light incident portion 72 is longer than a distance (a first light path length) from the light source 50 to the first light incident portion 71, not only a position of the light incident on the optical apparatus from the light source 50 but also an angle of the light can be recognized or detected. The configuration of the first light incident portion 71 and the second light incident portion 72 may be similar to those of the first exemplary embodiment. The optical axis adjustment based on the recognition (determination) or detection can be achieved by making light incident on a predetermined position of the first light incident portion 71 and making the light incident on a predetermined position of the second light incident portion 72. In addition, the adjustment unit 70 may be similar to that in the first exemplary embodiment.

Figure 8:
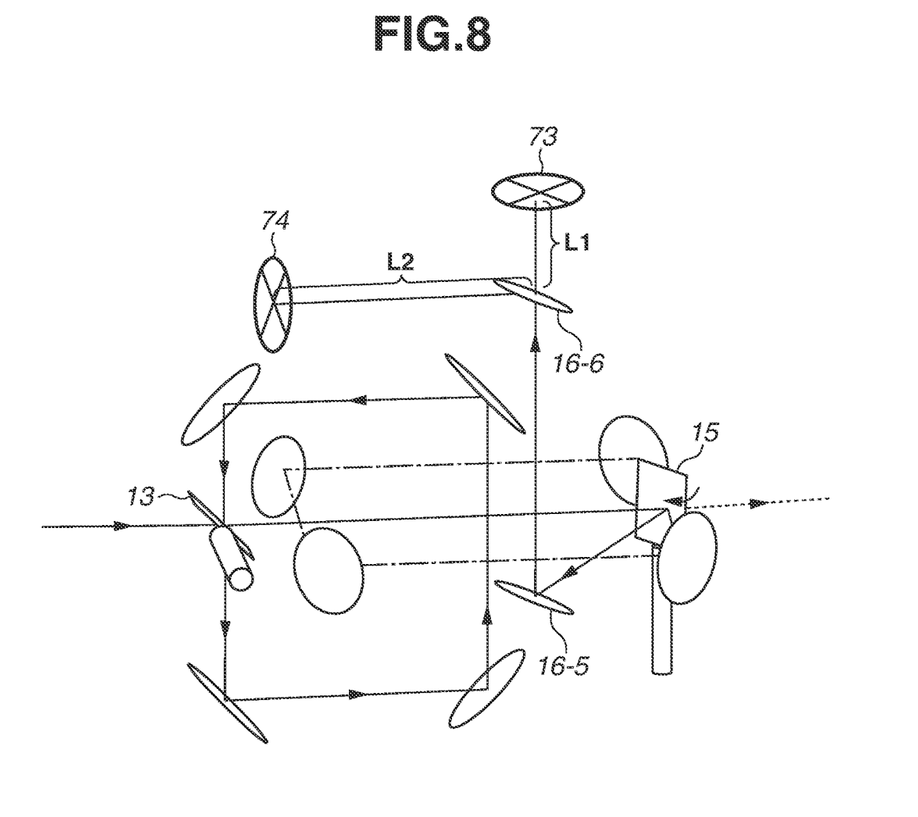
FIG. 8 illustrates another configuration example of the optical apparatus according to the second exemplary embodiment.

FIG. 8 illustrates another configuration example of the optical apparatus according to the second exemplary embodiment. In FIG. 8, the mirror member 15 is set at an angle for an optical axis adjustment (an angle that is different from a reference angle obtained by inclining the mirror member 15 by approximately 45 degrees with respect to the light beam 51 emitted from the light source 50). With this setting, the light, having been reflected by the mirror member 15, does not reach the mirrors 16-1, 16-2, 16-3, and 16-4, and is incident on a half mirror 16-6 via another mirror 16-5. Light transmitted through the half mirror 16-6 is incident on a first light incident portion 73. The position (deviation) of the incident light (beam) can be recognized (determined) by reading the position of the light incident on the first light incident portion 73 based on the index (line). The light having been reflected by the half mirror 16-6 is incident on a second light incident portion 74. The position (deviation) of the incident light (beam) can be recognized (determined) by reading the position of the light incident on the second light incident portion 74 based on the index (line). Since a distance (a second light path length) from the light source 50 to the second light incident portion 74 is longer than a distance (a first light path length) from the light source 50 to the first light incident portion 73 (L1<L2), not only a position of the light incident on the optical apparatus from the light source 50 but also an angle of the light can be recognized (determined) or detected. The configuration of the first light incident portion 73 and the second light incident portion 74 may be similar to that of the first exemplary embodiment. The optical axis adjustment based on the recognition (determination) or detection can be achieved by making the light incident on a predetermined position of the first light incident portion and making the light incident on a predetermined position of the second light incident portion 74. In addition, the adjustment unit 70 may be similar to that in the first exemplary embodiment.

According to the present exemplary embodiment, for example, it is possible to provide an optical apparatus that is advantageous for adjusting a path of incident light, as is discussed in the above description. In the present exemplary embodiment, a position of the light can be recognized (determined) or detected at two positions in the optical apparatus. Thus, even if the position of the light at the light inlet portion in the optical apparatus is not separately recognized or detected, the position and angle of the light that is incident on the optical apparatus can be recognized (determined) or detected accurately, which is advantageous.

Figure 9:
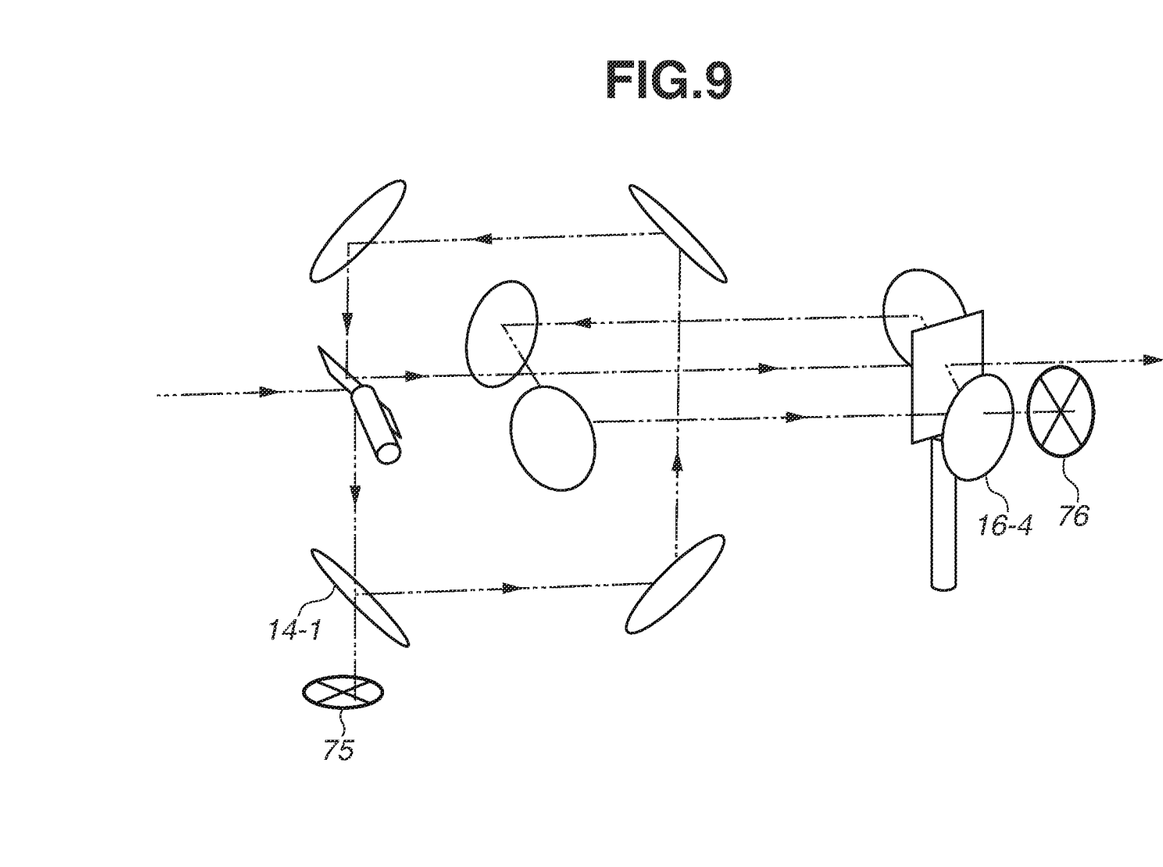
FIG. 9 illustrates a configuration example of an optical apparatus according to a third exemplary embodiment.

FIG. 9 illustrates a configuration example of an optical apparatus according to a third exemplary embodiment. This configuration includes the translational optical systems described with reference to FIG. 3, that is, the first translational optical system 61, on which the light beam 51 emitted from the light source 50 is incident, and the second translational optical system 62 on which the light having been emitted from the first translational optical system 61 is incident. In this configuration, when a high-output (energy) laser light is used for a drilling operation or the like, light having a sufficient amount (energy) to be useful for the drilling operation can be obtained at a light receiving element (a target object) on which the transmitted light is incident even when energy transmittance of any one of the mirrors 14-1 to 14-4 and the mirrors 16-1 to 16-4 remains relatively small. Therefore, the mirror member 13 is set at a reference angle (e.g., 45 degrees), and a first light incident portion 75 (comprising a light position detecting element such as a four-divided photodiode) on which the light, having been transmitted through a partially reflecting surface such as that of the mirror 14-1, is incident is disposed. This configuration allows the detection of a position of the light incident on the optical apparatus by the first light incident portion 75. In addition, a second light incident portion 76 (a light position detecting element such as a four-divided photodiode) on which the light, having been transmitted through a partially reflecting surface such as that of the mirror 16-4, is incident is disposed. This configuration allows the detection of the position of the light incident on the optical apparatus by the second light incident portion 76.

Since a distance from the light source 50 to the second light incident portion 76 (a second light path length) is longer than a distance from the light source 50 to the first light incident portion 75 (a first light path length), not only the position but also an angle of the light incident on the optical apparatus from the light source 50 can be recognized (determined) or detected. The configuration of the first light incident portion 75 and the second light incident portion 76 may be similar to that of the first exemplary embodiment. The optical axis adjustment based on the recognition (determination) or detection can be achieved by making the light incident on a predetermined position of the first light incident portion and making the light incident on a predetermined position of the second light incident portion 76. In addition, the adjustment unit 70 may be similar to that in the first exemplary embodiment.

According to the present exemplary embodiment, for example, it is possible to provide an optical apparatus that is advantageous for adjusting a path of incident light, as is described in the above description. In the present exemplary embodiment, a position of the light can be recognized (determined) or detected at two positions in the optical apparatus. Thus, even if the position of the light at the light inlet portion of the optical apparatus is not separately recognized or detected, the position and angle of the light that is incident on the optical apparatus can be recognized (determined) or detected, which is advantageous. Further, even when the mirror members 13 and are being driven (e.g., while an object is being machined), the position and angle of the light incident on the optical apparatus can be recognized (determined) or detected based on an output signal from the two light position detecting elements, which is advantageous. For example, it is possible to recognize (determine) or detect the position and the angle of the light incident on the optical apparatus based on the output signals of the two four-divided photodiodes of the first and second light incident portion 75, 76 when the mirror members 13 and 15 are at the reference position (angular position).

Figure 10:
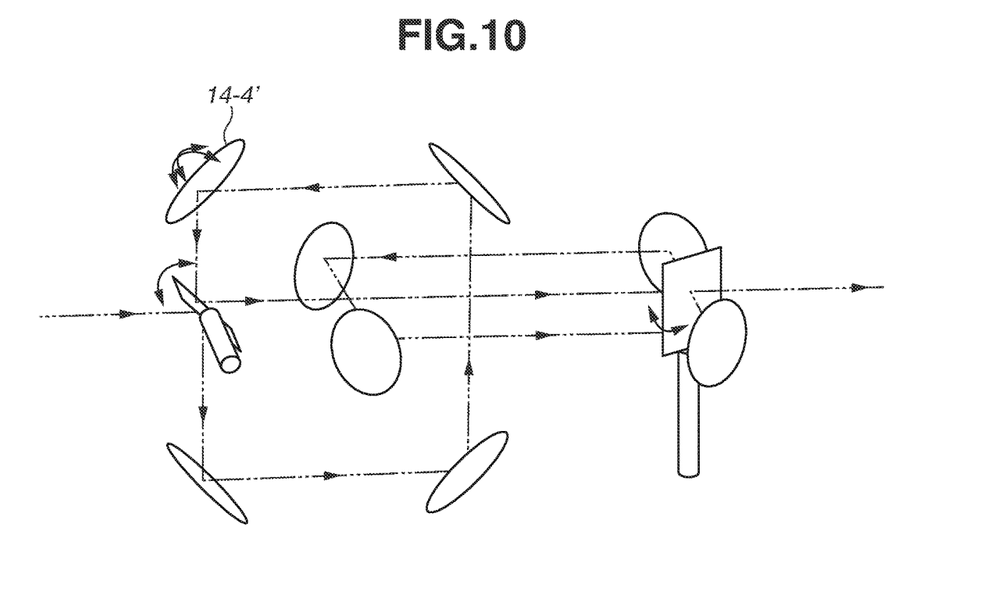
FIG. 10 illustrates a configuration example of an optical apparatus according to a fourth exemplary embodiment.

FIG. 10 illustrates a configuration example of an optical apparatus according to a fourth exemplary embodiment. This configuration includes the translational optical systems described with reference to FIG. 3, that is, the first translational optical system 61 on which the light beam 51 from the light source 50 is incident, and the second translational optical system 62 on which the light having been emitted from the first translational optical system 61 is incident. In the present exemplary embodiment, at least one of the mirrors 14-1 to 14-4 and the mirrors 16-1 to 16-4 (a plurality of reflecting surfaces) has an angle adjusting function. An angle of the light incident on the optical apparatus can be adjusted by the mirror (e.g., mirror 14-4') using the angle adjusting function. Deviation of a (passing) position of the light generated by the adjustment of the angle of the mirror, which has the angle adjusting mechanism, can be reduced (adjusted or compensated) by using an angle-variable mirror member (at least one of mirrors 13 and 15 in FIG. 3) for a translation of the light in the translational optical system.

According to the present exemplary embodiment, an angle (and a position) of light incident on the optical apparatus can be adjusted even when it is difficult to adjust the optical axis of the light source. In addition, according to the present exemplary embodiment, an angle and a position of light incident on the optical apparatus can be adjusted using two mirrors having an angle adjusting function (two mirrors among the mirrors 14-1 to 14-4 and the mirrors 16-1 to 16-4). Further, an application of the configuration according to the present exemplary embodiment to the optical apparatuses according to the first to third exemplary embodiments can provide an optical apparatus advantageous for an adjustment of a path of incident light as described in the above description.

Figure 11:
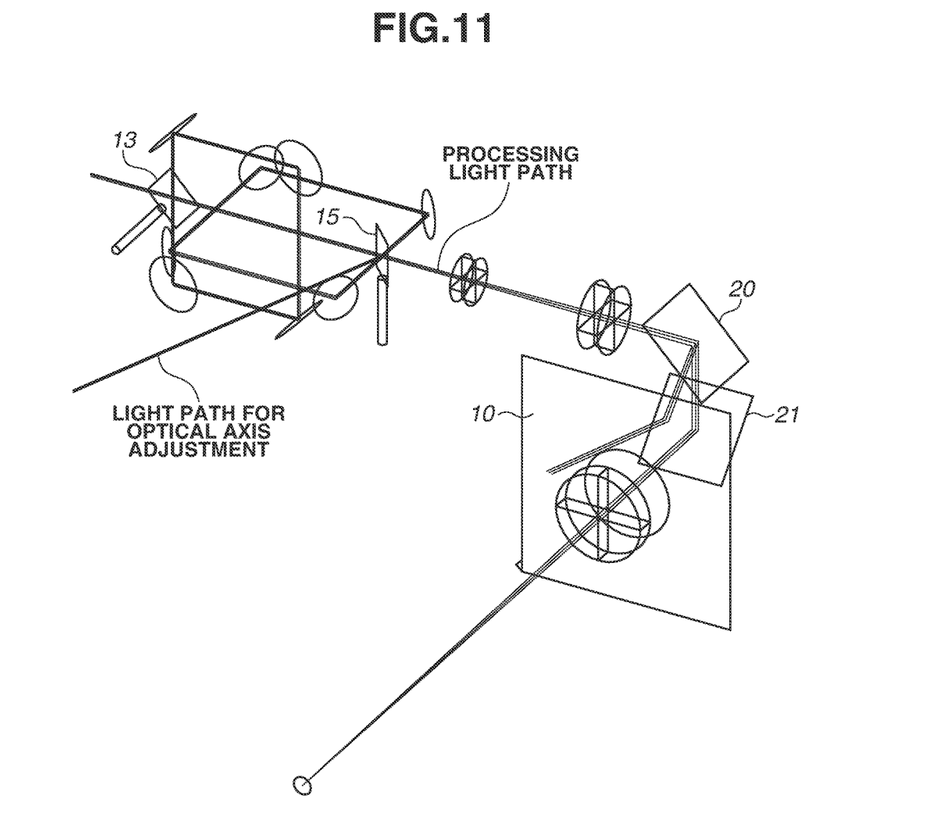
FIG. 11 illustrates a configuration example of a machining apparatus according to an exemplary embodiment.

In the first and second exemplary embodiments, when light is made incident on the light incident portions, it is possible to have slight transmitted light (some light) that is transmitted through the mirror members 2, 13, and 15. Other than that, no light is usually emitted from the optical apparatus (or the machining apparatus comprising the optical apparatus). However, when any of the mirror members is damaged, the light may be emitted (leaked) from the optical apparatus (the machining apparatus). FIG. 11 illustrates a configuration example of a machining apparatus according to an exemplary embodiment. In FIG. 11, when at least one of the mirror members 13 and 15 is damaged or defective, an unintended laser light can be emitted from the machining apparatus via a machining light path.

Therefore, as illustrated in FIG. 11, at least one of the (galvanometer) mirrors 20 and 21 in the deflection optical system is set at an angle exceeding an angle range for machining (an effective diameter of the rear optical system) so as to reduce or prevent any unintentional transmission (leakage) of the laser light. The setting allows the cover 10 (casing) of the optical apparatus or the machining apparatus to block the light, enabling a reduction or an elimination of the light being emitted from the machining apparatus undesirably. With this configuration, an additional component dedicated for reducing or eliminating the light such as a shutter is not needed. Thus, this configuration is advantageous in achieving a simplification and size-reduction of the optical apparatus or the machining apparatus.

Exemplary Embodiment Relating To Article Manufacturing Method

The machining apparatus according to the above-described exemplary embodiments may be used for an article manufacturing method. The article manufacturing method may include a step of machining an object using the machining apparatus and a step of processing the object machined in the machining step. The aforementioned optical apparatuses provided in the machining apparatus enable a parallel eccentric shift of the light beam incident on the condensing optical system using the translational optical system(s), and thus allows a change (adjustment) of an angle of the laser beam that is emitted (output) from the condensing optical system and incident on the object 23. As a result, it is possible to machine the object, for example by forming a tapered hole thereon, cutting, measuring and/or detecting with the laser beam output from the machining apparatus. The processing may include at least one of a machining operation that may be different from the above-described machining operations, such as a conveyance, an inspection, a sorting, an assembly, and a packaging operation, i.e. any operation wherein the machined object is subjected to an operation to manufacture an article comprising the machined object. The article manufacturing method of the present exemplary embodiment is advantageous in achieving at least one of a better performance, a better quality, a better productivity, and a reduced production cost involved in manufacturing articles, as compared with the conventional methods.

Although the exemplary embodiments of the present invention have been described above, it goes without saying that the present invention is not limited to these exemplary embodiments, and various modifications and alterations are possible within the scope of the gist of the invention.

According to the present invention, for example, it is possible to provide an optical apparatus that is advantageous for adjusting a path of incident light.

According to an aspect of the invention, there is provided a method of calibrating/adjusting/controlling a position and an angle of an incident light on a light inlet of an optical scanning apparatus using the optical apparatus according to any one of first, second, third or fourth exemplary embodiment described herein.

While the present invention has been described with reference to exemplary embodiments, it is to be understood that the invention is not limited to the disclosed exemplary embodiments.

This application claims the benefit of Japanese Patent Application No. 2016-168612, filed Aug. 30, 2016, which is hereby incorporated by reference herein in its entirety.

What is claimed is:

1. An optical apparatus for machining an object by irradiating the object, the apparatus comprising:
    a reflecting member including a first reflecting surface and a second reflecting surface;
    an optical system including a plurality of reflecting surfaces and configured to sequentially reflect light, which has been reflected by the first reflecting surface, on the plurality of reflecting surfaces to guide the reflected light to the second reflecting surface;
    a driving part configured to change an incidence angle of light incident on the first reflecting surface of the reflecting member;
    a control unit configured to control the driving part for controlling a path of light which has been reflected on the second reflecting surface; and
    a light incident portion configured to indicate a position of incident light which has been reflected by the first reflecting surface.

2. The optical apparatus according to claim 1, wherein the control unit is configured to control the driving part to guide the light, which has been reflected by the first reflecting surface, to the light incident portion.

3. The optical apparatus according to claim 2, further comprising a reflective optical element configured to reflect the light, which has been reflected by the first reflecting surface, to the light incident portion,
    wherein the control unit is configured to control the driving part to guide the light, which has been reflected by the first reflecting surface toward the reflective optical element.

4. The optical apparatus according to claim 1, wherein light transmitted through one of the plurality of reflecting surfaces of the optical system is incident on the light incident portion.

5. The optical apparatus according to claim 1, wherein the light incident portion includes at least one of a detecting element configured to detect the position of the incident light, a window for transmitting light which has been reflected by the first reflecting surface to the outside of the optical apparatus, and a screen for observing the incident light.

6. The optical apparatus according to claim 5, wherein the screen includes an index indicating the position of the incident light.

7. The optical apparatus according to claim 1, wherein the light incident portion includes a screen on which light which has been reflected by the first reflecting surface is incident, and an image pickup unit configured to image the light incident on the screen.

8. The optical apparatus according to claim 1, wherein at least one of the plurality of reflecting surfaces has an angle adjusting function.

9. The optical apparatus according to claim 1, further comprising:
    a second reflecting member including a third reflecting surface, on which the light output from the reflecting member is incident, and a fourth reflecting surface;
    a second optical system including a second set of a plurality of reflecting surfaces and configured to sequentially reflect the light, which has been reflected by the third reflecting surface, on the second set of the plurality of reflecting surfaces to guide light which has been reflected by the third reflecting surface to the fourth reflecting surface;
    a second driving part configured to change an incidence angle of the light incident on the third reflecting surface of the second reflecting member;
    a second control unit configured to control the second driving part for controlling a path of light which has been reflected on the fourth reflecting surface; and
    a second light incident portion configured to indicate a position of incident light which has been reflected by the third reflecting surface.

10. The optical apparatus according to claim 1, wherein the light incident portion includes a first light incident portion located at a position separated from the first reflecting surface by a first light path length and a second light incident portion located at a position separated from the first reflecting surface by a second light path length.

11. The optical apparatus according to claim 1, further comprising an adjuster configured to, based on the indicated position of the incident light which has been reflected by the first reflecting surface, adjust at least one of:
    an arrangement configuration between the optical apparatus and a light source which emits light toward the first reflecting surface of the reflecting member; and
    a path of light emitted from the light source before being reflected on the first reflecting surface.

12. The optical apparatus according to claim 1, wherein light which has been reflected by the first reflecting surface is incident on the light incident portion not via the optical system.

13. The optical apparatus according to claim 1, further comprising:
    a fixed mirror different from the optical system,
    wherein light which has been reflected by the first reflecting surface is incident on the light incident portion after being reflected by the fixed mirror.

14. A machining apparatus for machining an object, the machining apparatus comprising:
    an optical apparatus; and
    a condensing optical system configured to condense the light output from the optical apparatus to irradiate the object with the condensed light,
    wherein the optical apparatus including,
    a reflecting member including a first reflecting surface and a second reflecting surface;
    an optical system including a plurality of reflecting surfaces and configured to sequentially reflect light, which has been reflected by the first reflecting surface, on the plurality of reflecting surfaces to guide the reflected light to the second reflecting surface;

a driving part configured to change an incidence angle of light incident on the first reflecting surface of the reflecting member;

a control unit configured to control the driving part for controlling a path of light which has been reflected on the second reflecting surface; and a light incident portion configured to indicate a position of incident light which has been reflected by the first reflecting surface.

15. The machining apparatus according to claim 14, further comprising a deflection optical system configured to deflect light output from the optical apparatus, wherein, when the control unit controls the driving part to guide the light, which has been reflected by the first reflecting surface, to the light incident portion, the control unit is configured to control the deflection optical system so that light output from the machining apparatus is not irradiating the target position.

16. The machining apparatus according to claim 14, wherein the light incident portion detects the position of incident light which has been reflected by the first reflecting surface.

17. An article manufacturing method comprising:

machining an object using a machining apparatus by irradiating the object;

wherein the machining apparatus comprises:

an optical apparatus; and a condensing optical system configured to condense the light output from the optical apparatus to irradiate the object with the condensed light, wherein the optical apparatus including, a reflecting member including a first reflecting surface and a second reflecting surface;

an optical system including a plurality of reflecting surfaces and configured to sequentially reflect light, which has been reflected by the first reflecting surface, on the plurality of reflecting surfaces to guide the reflected light to the second reflecting surface;

a driving part configured to change an incidence angle of light incident on the first reflecting surface of the reflecting member;

a control unit configured to control the driving part controlling a path of light which has been reflected on the second reflecting surface; and a light incident portion configured to indicate a position of incident light which has been reflected by the first reflecting surface.

18. A non-transitory computer readable storage medium storing a program comprising instructions which, when the program is executed by a machining apparatus, cause the machining apparatus to carry out an article manufacturing method, wherein the article manufacturing method comprising:

machining an object using a machining apparatus by irradiating the object;

wherein the machining apparatus comprising:

an optical apparatus; and a condensing optical system configured to condense the light output from the optical apparatus to irradiate the object with the condensed light, wherein the optical apparatus including, a reflecting member including a first reflecting surface and a second reflecting surface;

an optical system including a plurality of reflecting surfaces and configured to sequentially reflect light, which has been reflected by the first reflecting surface, on the plurality of reflecting surfaces to guide the reflected light to the second reflecting surface;

a driving part configured to change an incidence angle of light incident on the first reflecting surface of the reflecting member;

a control unit configured to control the driving part for controlling a path of light which has been reflected on the second reflecting surface can be controlled; and a light incident portion configured to indicate a position of incident light which has been reflected by the first reflecting surface.

\* \* \* \* \*